United States Patent
Yusuf (10) Patent No.: US 11,764,747 B2
(45) Date of Patent: Sep. 19, 2023

(54) TRANSFORMER BALUN FOR HIGH REJECTION UNBALANCED LATTICE FILTERS

(71) Applicant: Qorvo US, Inc., Greensboro, NC (US)

(72) Inventor: Yazid Yusuf, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/456,747

(22) Filed: Nov. 29, 2021

(65) Prior Publication Data

US 2023/0170868 A1 Jun. 1, 2023

(51) Int. Cl.
| | | |
|---|---|---|
| *H03H 7/01* | (2006.01) | |
| *H03H 7/09* | (2006.01) | |
| *H01F 27/28* | (2006.01) | |
| *H01F 27/36* | (2006.01) | |

(52) U.S. Cl.
CPC ........... *H03H 7/0115* (2013.01); *H01F 27/28* (2013.01); *H01F 27/363* (2020.08); *H03H 7/09* (2013.01)

(58) Field of Classification Search
CPC ............. H03H 2001/0085; H03H 7/09; H03H 7/0115; H01F 27/28
USPC ........................................ 333/175, 177, 185
See application file for complete search history.

(56) References Cited

U.S. PATENT DOCUMENTS

| | | | | |
|---|---|---|---|---|
| 2004/0105205 A1* | 6/2004 | Anthony | .............. | H03H 1/0007 361/111 |
| 2008/0101263 A1* | 5/2008 | Barber | .................... | H04B 1/52 370/282 |
| 2013/0154768 A1* | 6/2013 | Taniguchi | ................ | H03H 7/09 333/185 |
| 2015/0371762 A1* | 12/2015 | Ishizuka | ............. | H01F 17/0013 336/200 |
| 2016/0142037 A1* | 5/2016 | Tanaka | ..................... | H01F 27/29 333/26 |
| 2019/0180916 A1* | 6/2019 | Tseng | .................... | H01L 23/645 |

OTHER PUBLICATIONS

Chen, C.H. et al., "Very Compact Transformer-Coupled Balun-Integrated Bandpass Filter using Integrated Passive Device Technology on Glass Substrate," 2010 IEEE MTT-S International Microwave Symposium, May 23-28, 2010, Anaheim, CA, USA, IEEE, 4 pages.

Chen, W.Z. et al., "Three-Dimensional Fully Symmetric Inductors, Transformer, and Balun in CMOS Technology," IEEE Transactions on Circuits and Systems—I: Regular Papers, vol. 54, No. 7, Jul. 2007, IEEE, pp. 1413-1423.

(Continued)

*Primary Examiner* — Rakesh B Patel
(74) *Attorney, Agent, or Firm* — Withrow & Terranova, P.L.L.C.

(57) ABSTRACT

A transformer balun for high rejection unbalanced lattice filters includes two symmetrical coils separated by a shielding element. In a further exemplary aspect, the transformer may include a conductor, which may be a third coil that operates with a capacitor to form a resonant circuit that enhances mutual coupling. Using either of the exemplary transformers provides improved performance in the passband while concurrently providing out-of-band rejection at levels exceeding seventy decibels (70 dB).

20 Claims, 11 Drawing Sheets

(56) References Cited

OTHER PUBLICATIONS

De Moraes, F.B. et al., "Comparison Between Three- and Four-coil Wireless Power Transfer Systems with Resonant Coils," Journal of Microwaves, Optoelectronics and Electromagnetic Applications, vol. 20, No. 1, Mar. 2021, SBMO/SBMag, pp. 208-218.
Gan, H. et al., "Integrated Transformer Baluns for RF Low Noise and Power Amplifiers," IEEE Radio Frequency Integrated Circuits (RFIC) Symposium, Jun. 10-13, 2006, San Francisco, CA, IEEE, 4 pages.

* cited by examiner

TRANSFORMER BALUN FOR HIGH REJECTION UNBALANCED LATTICE FILTERS

FIELD OF THE DISCLOSURE

The present disclosure relates to a transformer for use with a lattice filter.

BACKGROUND

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. With the advent of the myriad functions available to such devices, there has been increased pressure to improve the speed with which data is transferred to and from such mobile communication devices.

The pressure to improve speed has led to the evolution of the cellular standards commonly used by the mobile communication devices from the third generation (3G) to the fourth generation (4G or long-term evolution (LTE)) and more recently fifth generation new radio (5G-NR). With the advent of LTE, the concept of carrier aggregation was introduced, with a commensurate demand for high-performance wideband filters.

Filters based on coupled resonator filters (CRFs) provide large bandwidths, but have spurious modes, which degrade filter rejection. While solidly mounted resonator (SMR) configurations can mitigate spurious modes, suppression remains imperfect and is sensitive to variation in reflector layer thicknesses. Accordingly, there remains room for improved filters for use by wireless networks.

SUMMARY

Aspects disclosed in the detailed description include a transformer balun for high rejection unbalanced lattice filters. In particular, exemplary aspects of the present disclosure provide a transformer coupled to a lattice filter where the transformer includes two symmetrical coils separated by a shielding element. In a further exemplary aspect, the transformer may include a conductor, which may be a third coil that operates with a capacitor to form a resonant circuit that enhances mutual coupling. Using either of the exemplary transformers provides improved performance in the passband while concurrently providing out-of-band rejection at levels exceeding seventy decibels (70 dB).

In a first exemplary aspect, a transformer is disclosed. The transformer comprises a first coil comprising an input. The transformer also comprises a second coil inductively coupled to the first coil. The second coil comprises an output. The transformer also comprises a resonant circuit comprising a third coil and a third capacitor. The third coil is inductively coupled to the first coil and the second coil.

In another exemplary aspect, a filter system is disclosed. The filter system comprises a lattice filter comprising a lattice output. The filter system also comprises a transformer. The transformer comprises a first coil comprising an input coupled to the lattice output. The transformer also comprises a second coil inductively coupled to the first coil. The second coil comprises an output. The transformer also comprises a resonant circuit comprising a third coil and a third capacitor. The third coil is inductively coupled to the first coil and the second coil.

In another exemplary aspect, a filter system is disclosed. The filter system comprises a lattice filter comprising a filter output. The filter system also comprises a transformer. The transformer comprises a first coil comprising an input coupled to the filter output. The first coil has an axis of symmetry and is symmetrical across the axis of symmetry. The transformer also comprises a second coil inductively coupled to the first coil. The second coil comprises an output. The second coil has a second axis of symmetry and is symmetrical across the second axis of symmetry. The transformer also comprises a shielding trace proximate the first coil and the second coil. The shielding trace is configured to reduce cross-capacitance between the first coil and the second coil.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items. It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a transformer balun for high rejection unbalanced lattice filters. In particular, exemplary aspects of the present disclosure provide a transformer coupled to a lattice filter where the transformer includes two symmetrical coils separated by a shielding element. In a further exemplary aspect, the transformer may include a conductor, which may be a third coil that operates with a capacitor to form a resonant circuit that enhances mutual coupling. Using either of the exemplary transformers provides improved performance in the passband while concurrently providing out-of-band rejection at levels exceeding seventy decibels (70 dB).

Figure 1A:
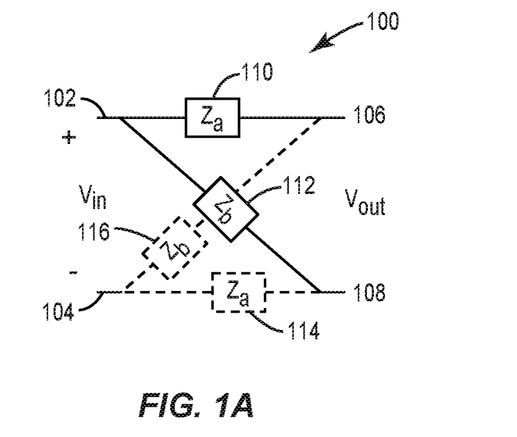
FIG. 1A is a block diagram of a lattice filter topology that may benefit from exemplary aspects of the present disclosure.
Figure 1B:
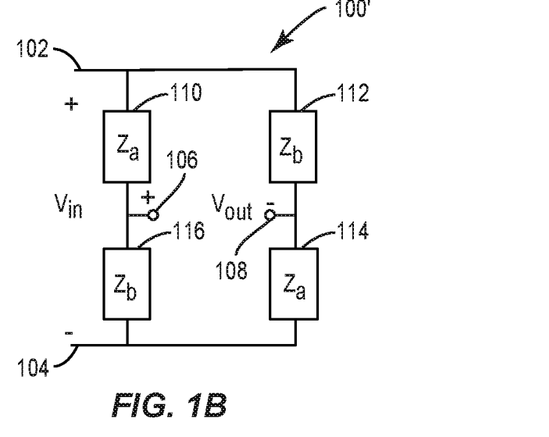
FIG. 1B is a block diagram of an equivalent balanced bridge form of the lattice filter of FIG. 1A.
Figure 2A:
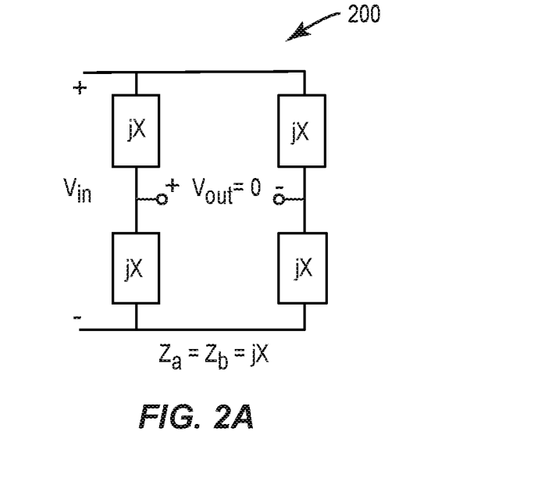
FIG. 2A illustrates operation of the lattice filter of FIG. 1B in a stopband frequency.
Figure 2B:
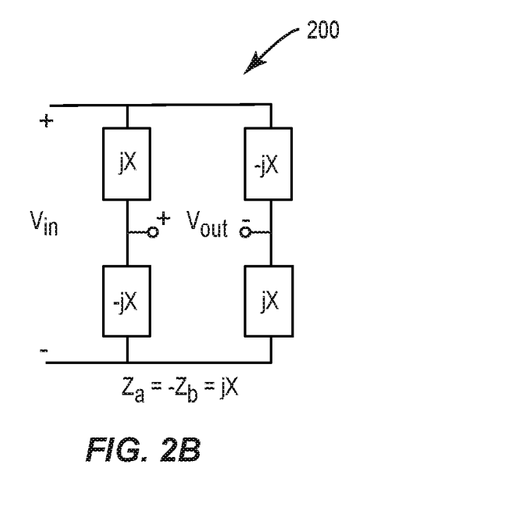
FIG. 2B illustrates operation of the lattice filter of FIG. 1B in a passband frequency.
Figure 3:
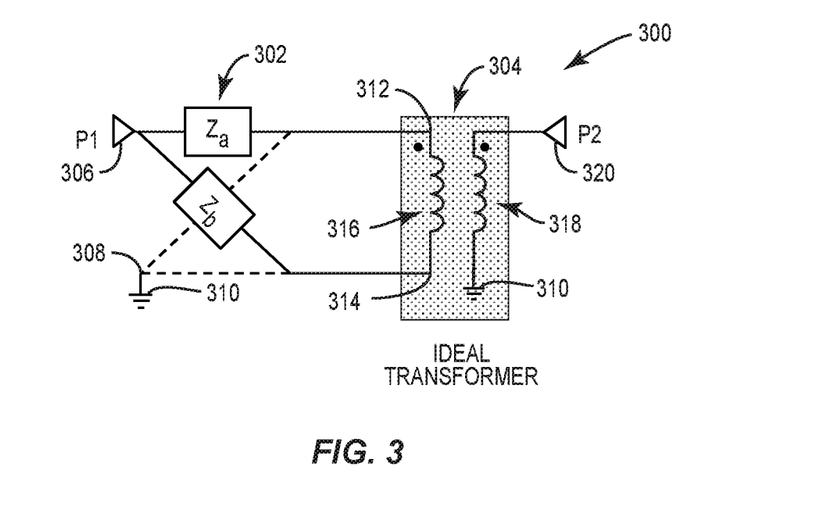
FIG. 3 illustrates a lattice filter with an ideal transformer to operate in an unbalanced mode.

Before addressing exemplary aspects of the present disclosure, an overview of a lattice filter is provided with reference to FIGS. 1A through 2B, along with an analysis of how such a lattice filter may be coupled to a transformer to provide unbalanced operation with reference to FIG. 3. The limits of adding a conventional transformer are explored with reference to FIGS. 4-7C. A discussion of exemplary aspects of the present disclosure begins below with reference to FIG. 8A.

In this regard, FIG. 1A illustrates a block diagram of a lattice filter 100. The lattice filter 100 includes a positive input 102 and a negative input 104 that collectively form a Vin input. The lattice filter 100 further includes a positive output 106 and a negative output 108 that collectively form a Vout output. A first impedance 110 (Za) is located serially between the positive input 102 and the positive output 106. A second impedance 112 (Zb) is located serially between the positive input 102 and the negative output 108. Likewise, a third impedance 114, which is identical to the first impedance 110, is located serially between the negative input 104 and the negative output 108. Also, a fourth impedance 116, which is identical to the second impedance 112, is located serially between the negative input 104 and the positive output 106. Normally, Za and Zb are reactive to reduce filter loss.

Frequently, for simplicity, illustration of the third impedance 114 and the fourth impedance 116 is omitted or referenced using dotted lines. FIG. 1A shows the elements for completeness, but subsequent representations (e.g., the lattice filter 302 of FIG. 3) omits explicit illustration of these impedances. FIG. 1B illustrates the same lattice filter 100 but presented in a balanced bridge form 100' It should be appreciated that the impedances Za, Zb are frequency dependent and may be expressed as $Z(\omega)=jX(\omega)$. FIG. 2A illustrates a lattice filter 200 operating in a stopband when the impedances Za and Zb are equal (i.e., $Za=Zb=jX$) and Vout equals zero (Vout=0). Conversely, FIG. 2B illustrates the lattice filter 200 operating in a passband when $Za=-Zb=jX$.

In either case, stopband or passband, the filters 100, 200 are balanced. Most radio frequency systems are unbalanced since unbalanced systems are simpler in terms of routing compared to balanced systems. A balun may be used to convert the lattice filter 100, 200 to an unbalanced system. One possible balun is a transformer.

In this regard, FIG. 3 illustrates a filter system 300 having a lattice filter 302 coupled at Vout to an ideal transformer 304. The lattice filter 302 includes a positive input 306 coupled to a port P1. The lattice filter 302 also includes a negative input 308 coupled to a ground 310. The lattice filter 302 also includes a positive output 312 and a negative output 314. A first coil 316 of the ideal transformer 304 serially connects the positive output 312 to the negative output 314. The first coil 316 is inductively coupled to a second coil 318 of the ideal transformer 304. The second coil 318 is coupled to the ground 310 and to an output 320 with port P2.

Figure 4:
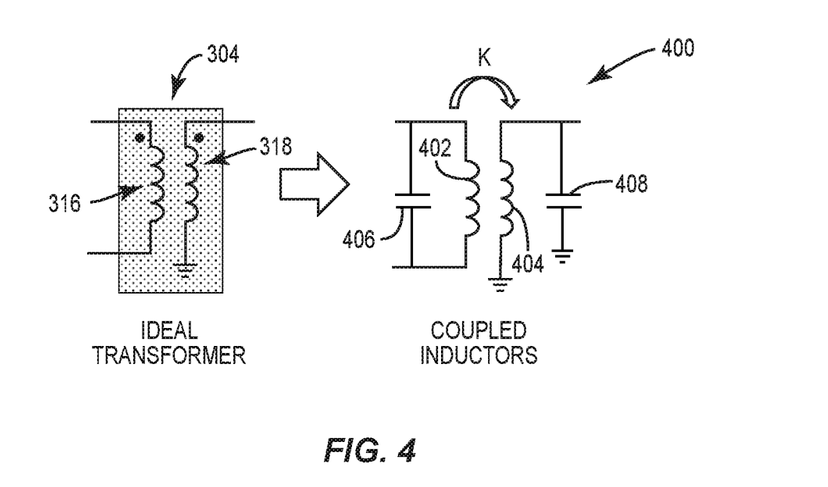
FIG. 4 illustrates a practical transformer based on an ideal transformer.

While an ideal transformer 304 is desired, the ideal transformer 304 is more likely to be instantiated as a real (as opposed to ideal) transformer 400 with two coupled inductors 402, 404 as illustrated in FIG. 4. Additional capacitors 406, 408 may be used to compensate for self-inductances. It should be appreciated that the combination of the inductor 402 with the capacitor 406 and of the inductor 404 with the capacitor 408 form two resonators, and thus are technically a second order filter. The transformer 400 has a coupling coefficient K between the first inductor 402 and the second inductor 404. Higher coupling coefficients K are desirable as such allows for larger bandwidths and lower loss. At the frequencies of interest, magnetic materials are usually lossy and laminates are typically non-magnetic. The inability to use magnetic materials effectively limits the mutual coupling (K) to those achievable through physical geometries.

Figure 5A:
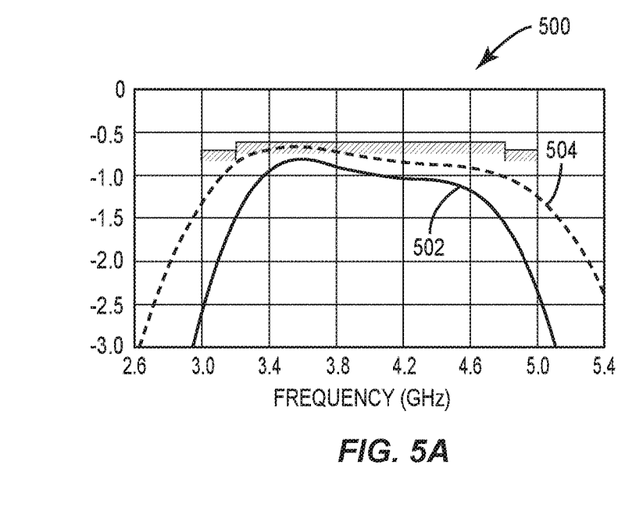
FIG. 5A illustrates operation in the passband of the practical transformer of FIG. 4.
Figure 5B:
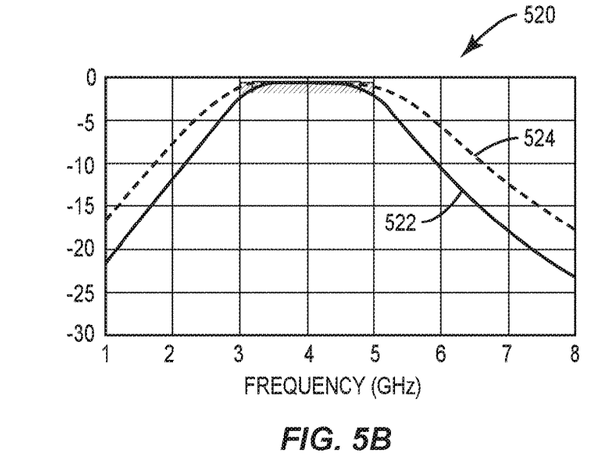
FIG. 5B illustrates operation, and particularly rejection, across a wideband.

For example, FIG. 5A illustrates via graph 500 how a transformer having K=0.4 responds (line 502) in the passband region. The graph 500 also illustrates how a transformer having K=0.5 responds (line 504). It should be apparent that line 504 has better passband characteristics including a broader passband range and less attenuation in the passband than line 502. Graph 520 in FIG. 5B shows performance across a wideband range, and particularly shows the rejection range. Specifically, line 522 shows the transformer with K=0.4 and line 524 shows the transformer with K=0.5. While line 522 has greater rejection, line 522 also has a smaller passband area, and thus, the performance of the transformer with K=0.5 (line 524) is deemed more desirable.

Figure 6A:
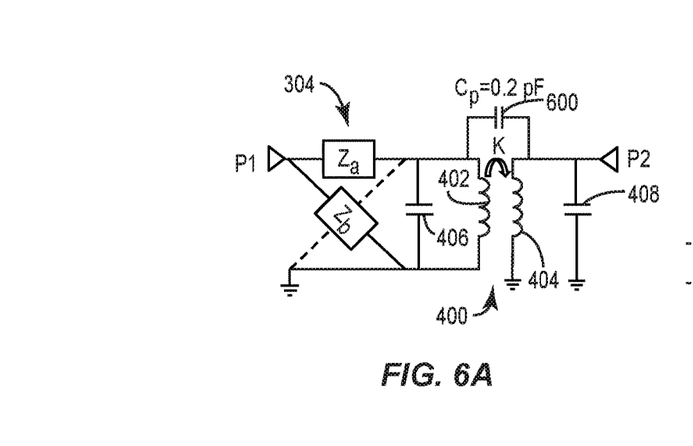
FIG. 6A is a schematic diagram of a practical transformer with a lattice filter, and particularly showing a first type of parasitic capacitance.
Figure 6B:
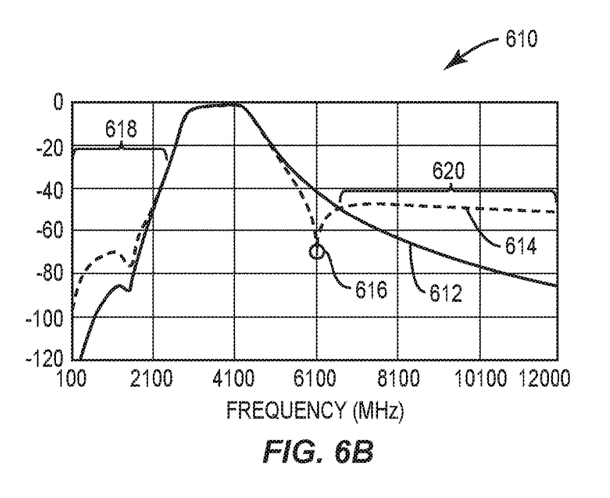
FIG. 6B illustrates operation, and particularly rejection, across a wideband of the circuit of FIG. 6A with and without the parasitic capacitance to illustrate the reduced rejection.

When the transformer 400 is used in a lattice filter system in place of an ideal transformer, parasitic capacitances between transformer windings may influence the in-band loss and out-of-band rejection of the filter system. Specifically, as illustrated in FIG. 6A, there may be a parasitic capacitance 600 present between the inductors 402, 404 of the transformer 400. FIG. 6B shows graph 610 comparing line 612 corresponding to the response of the lattice filter system without parasitic capacitance to line 614 corresponding to the response of the lattice filter system with parasitic capacitance 600. While there is a slightly steeper rejection around 6.1 GHz (area 616), the overall rejection outside of this range is generally inferior to that shown by line 612 (area 618 or 620). At some of the frequencies of interest, the detrimental effect on filter rejection is greater than thirty decibels (>30 dB).

Figure 7A:
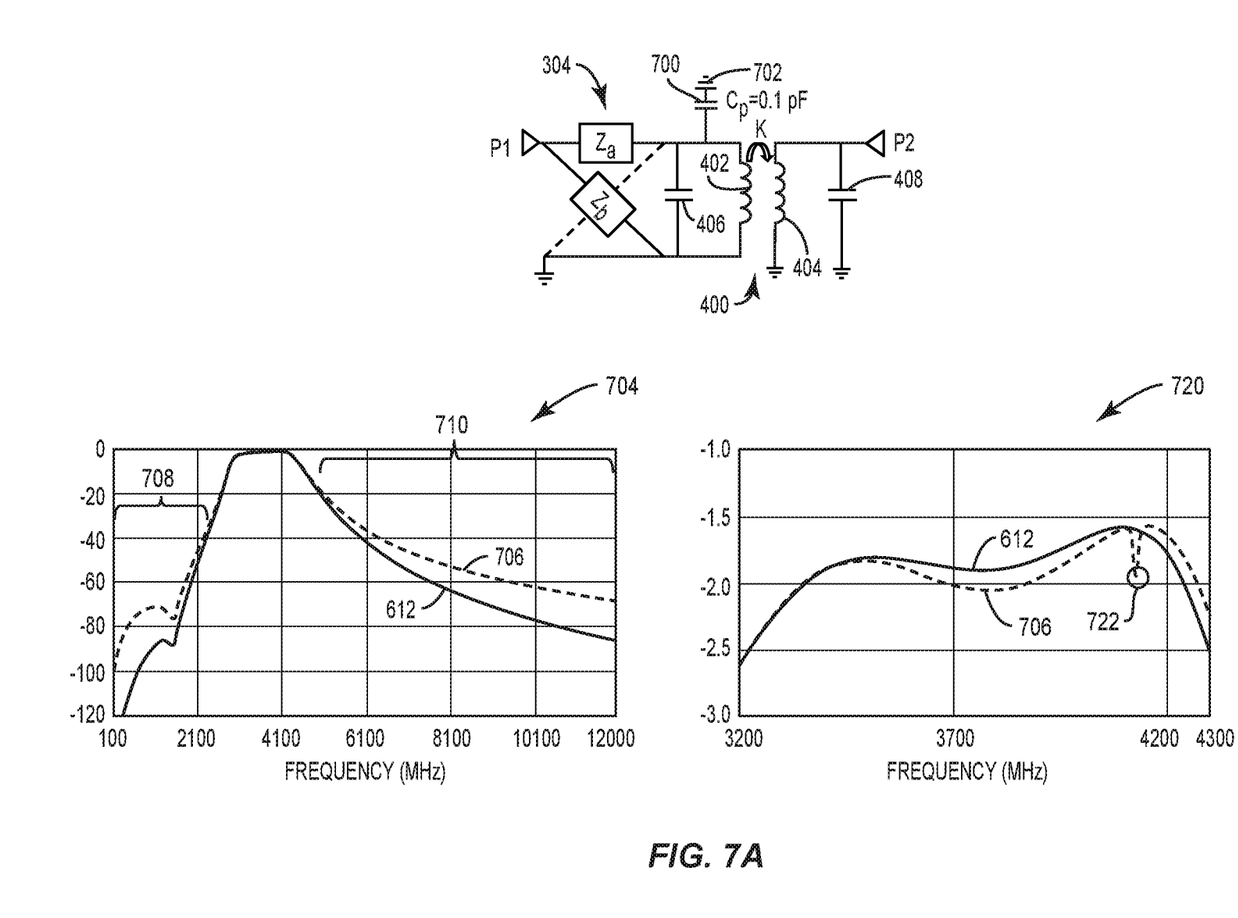
FIG. 7A illustrates a schematic diagram of a practical transformer with a lattice filter, and particularly showing a second type of parasitic capacitance, while the graphs show the wideband and passband operation compared to a circuit with no parasitic capacitance.
Figure 7B:
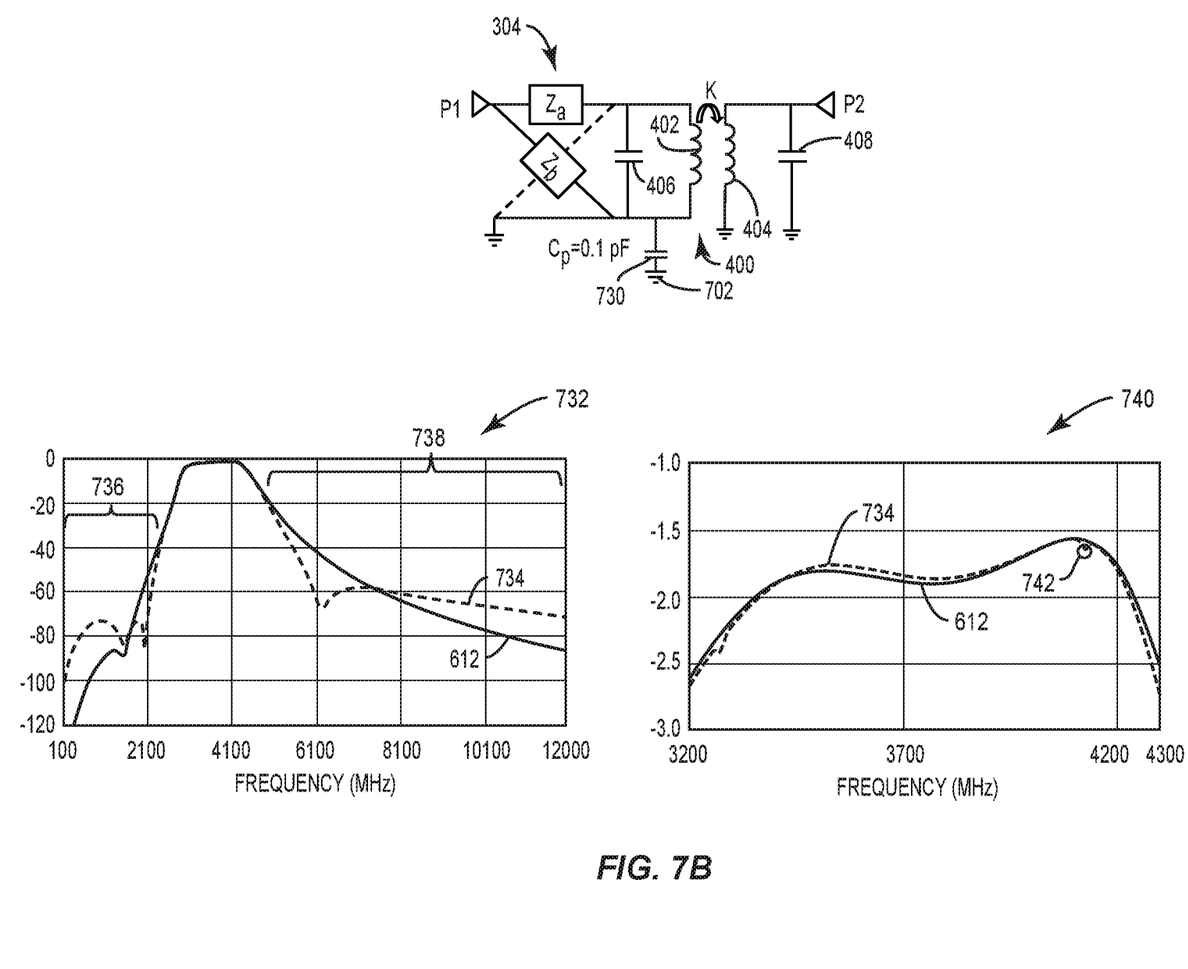
FIG. 7B illustrates a schematic diagram of a practical transformer with a lattice filter, and particularly showing a third type of parasitic capacitance, while the graphs show the wideband and passband operation compared to a circuit with no parasitic capacitance.
Figure 7C:
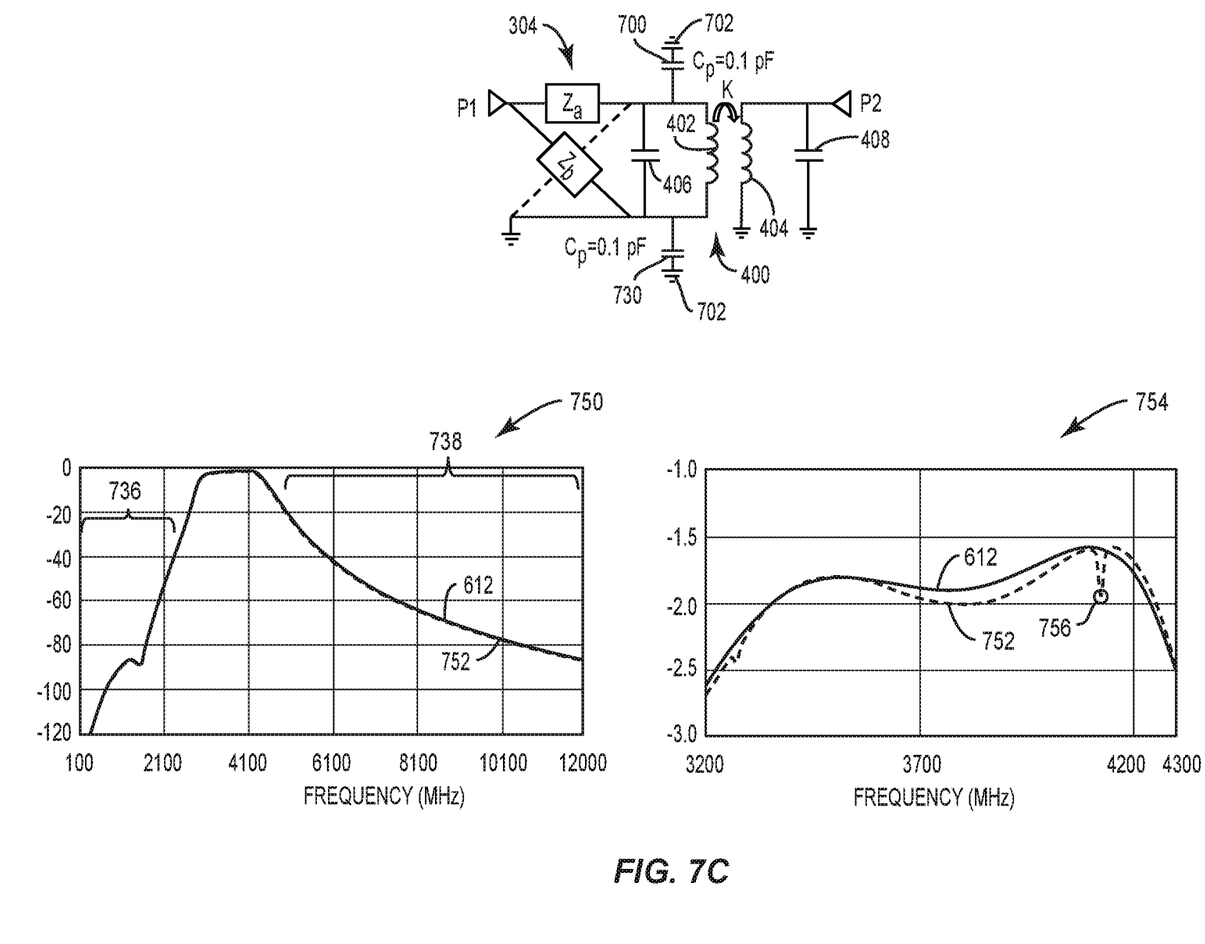
FIG. 7C illustrates a schematic diagram of a practical transformer with a lattice filter, and particularly showing a both the second and third type of parasitic capacitance, while the graphs show the wideband and passband operation compared to a circuit with no parasitic capacitance.

FIGS. 7A-7C illustrate other possible sources of parasitic capacitance and the corresponding impact on both passband and out-of-band performance. Thus, FIG. 7A illustrates the parasitic capacitance 700 that may exist between an input of the first inductor 402 and ground 702. Graph 704 compares the wideband response for line 612 (no parasitic) to the line 706 (added parasitic capacitance 700). The presence of the parasitic capacitance 700 reduces the rejection in zones 708 and 710. Likewise, as illustrated by graph 720, in the passband, line 706 has a notch 722 reflecting unwanted attenuation in the passband.

FIG. 7B illustrates the parasitic capacitance 730 that may exist between an output of the first inductor 402 and ground 702. Graph 732 compares the wideband response for line 612 (no parasitic) to the line 734 (added parasitic capacitance 730). The presence of the parasitic capacitance 730 reduces the rejection in zones 736 and 738. Likewise, as illustrated by graph 740, in the passband, line 734 has a notch 742 reflecting unwanted attenuation in the passband, although notch 742 is relatively small compared to notch 722.

FIG. 7C illustrates both the parasitic capacitance 700 and 730. Graph 750 compares the wideband response for line 612 (no parasitic) to the line 752 (added parasitic capacitances 700 and 730). The presence of the parasitic capacitance 700 and 730 makes the lines 612 and 752 essentially identical across the rejection frequencies. However, as illustrated in graph 754, in the passband, the parasitic capacitances negatively impact the performance with increased attenuation and notch 756.

As noted above, because magnetic materials are lossy at the frequencies of interest, coupling is controlled by the physical geometries, and particularly by a separation between inductor traces. Current manufacturing limitations may place design constraints on minimum trace separation and layer thickness, which places an upper limit on K. Further, the design of the transformer and its nonidealities should be carefully considered to preserve the high rejection of the lattice filter. Likewise, to preserve desired performance, the transformer should have a high common mode rejection (CMR), which is negatively impacted by parasitic capacitances.

To implement an effective balun at the frequencies of interest, exemplary aspects of the present disclosure add electrostatic shielding between the transformer traces. One approach is to put the shielding traces between the transformer windings and tie them to ground. Tying to ground reduces any cross-capacitance between the windings. An exemplary implementation of this shielding is provided with reference to FIGS. 8A and 8B.

Figure 8A:
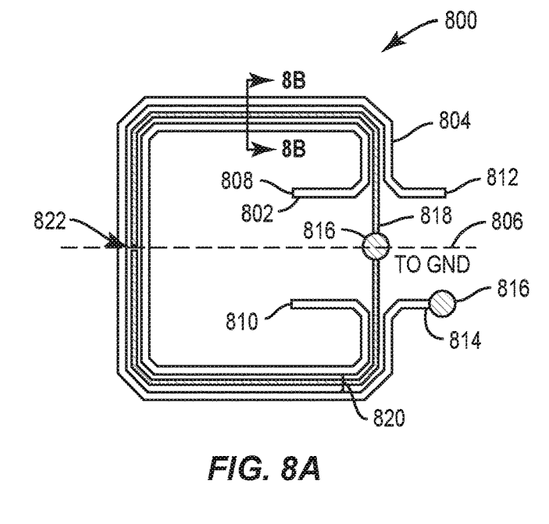
FIG. 8A illustrates a top plan view of an exemplary planar transformer structure with shielding between the coils.
Figure 8B:
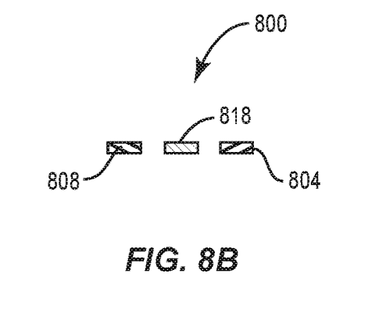
FIG. 8B illustrates a cross-sectional view of the transformer structure of FIG. 8A taken along lines 8B-8B.

Specifically, FIGS. 8A and 8B illustrate a planar transformer 800 configured to be coupled to a lattice filter. The transformer 800 includes a first coil 802 (sometimes referred to as a primary coil) corresponding to the inductor 402. The transformer 800 also includes a second coil 804 (sometimes referred to as a secondary coil) corresponding to the inductor 404. The first coil 802 and the second coil 804 are symmetrical across an axis of symmetry 806. As illustrated, the first coil 802 and the second coil 804 are symmetrical across a single axis of symmetry. However, there may be situations (not illustrated) where the second coil 804 is symmetrical across a second axis of symmetry. Alternatively, it is possible to think of the coils 802, 804 being symmetrical across respective first and second axes of symmetry, but as illustrated the first and second axes of symmetry are identical. The first coil 802 includes a first input 808 and a second input 810. Vout from the lattice filter may be applied across the inputs 808, 810. The second coil 804 includes a first output 812 and a second output 814. The second output 814 may be coupled to ground 816.

A shielding trace 818 is positioned between the first coil 802 and the second coil 804. That is, the coils 802, 804 may be formed from flat conductive metal traces positioned in a plane and having a physical gap 820 therebetween. The shielding trace 818 may be a flat conductive metal or conductive trace (e.g., a conductor) that forms a coil that is positioned in the same plane within the physical gap 820. The shielding trace 818 is coupled to ground 816. Further, the shielding trace 818 is cut 822 at any point within the coil of the shielding trace 818. The planar positioning of the two coils 802, 804 relative to the shielding trace 818 (also illustrated in FIG. 8B) is helpful to reduce parasitic capacitance from the coil 802 to ground 816 and thus helps to reduce the notches 722, 742, 756 seen in FIGS. 7A-7C.

The presence of the shielding trace 818 reduces mutual capacitance of the coils 802, 804. While not shown, to reduce capacitive coupling further, additional traces may be placed in layers above and/or below the plane of the coils 802, 804. The cut 822 is present to minimize current flow in the shielding trace 818 so as not to impact the mutual coupling of the coils 802, 804.

Figure 8C:
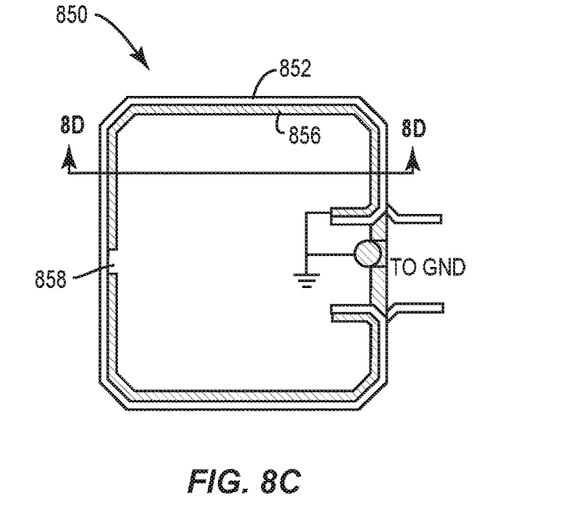
FIG. 8C illustrates a top plan view of an alternate exemplary transformer structure with coils lying in different planes.
Figure 8D:
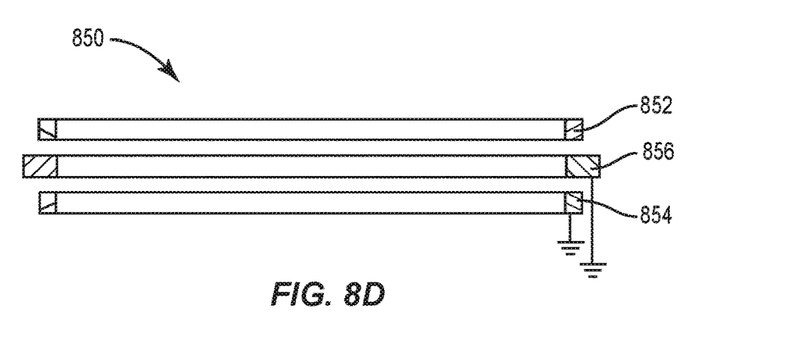
FIG. 8D illustrates a cross-sectional view of the transformer structure of FIG. 8C taken along lines 8D-8D.

While FIGS. 8A and 8B illustrate a planar transformer 800, the present disclosure is not so limited. Thus, FIGS. 8C and 8D illustrate a similar transformer 850 with a first coil 852 positioned in a first plane, a second coil 854 positioned in a second plane directly above the first coil 852 with a shielding trace 856 positioned in a third plane between the first and second plane. The shielding trace 856 may include a cut 858 similar to cut 822. Likewise, the second coil 852 and the shielding trace 856 are coupled to ground.

Figure 9:
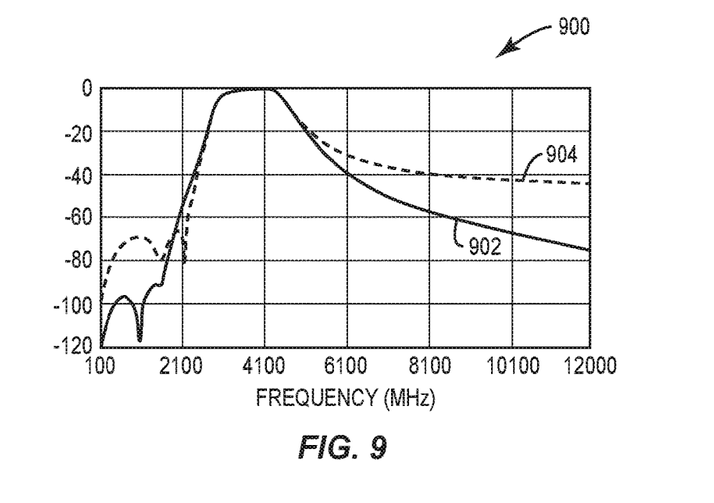
FIG. 9 illustrates a graph showing the wideband operation, and particularly the rejections possible with and without shielding.

FIG. 9 provides a graph 900 that shows the response of the lattice filter system using transformer 800 in line 902 compared to a similar transformer without the shielding in line 904. As is readily apparent, the rejection at the frequencies of interest is greater with the shielding trace 818 than without the shielding.

There are other ways to reduce parasitic capacitance. One such method is to use laminate stacks with lower electrical permittivity, although the number of commercially available materials is currently limited. Another possible approach is to reduce the width of the first coil 802 and/or the shielding trace 818. Such reduction will also reduce the Q of the first coil 802 and/or reduce the effectiveness of the shielding. Additionally, the traces are generally at the smallest spacing permitted by the manufacturing process to achieve the largest possible coupling, so there is likely little room for improvement using this technique. Still another possible approach is to remove (at least partially) any dielectric material between the first coil 802 and the second coil 804. This approach poses substantial manufacturing challenges using current technologies.

Figure 10A:
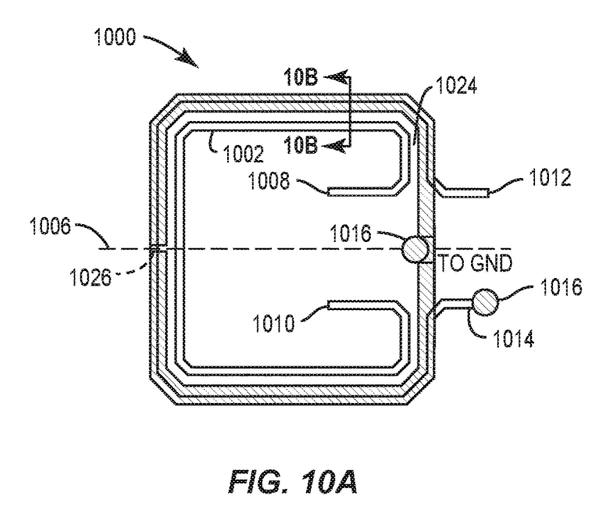
FIG. 10A illustrates a top plan view of another exemplary transformer structure with shielding between the coils.
Figure 10B:
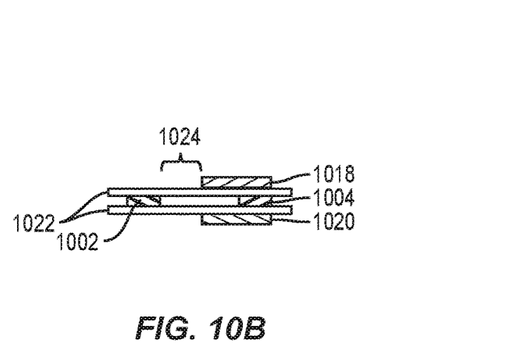
FIG. 10B is a cross-sectional elevation view of the transformer of FIG. 10A that better illustrates the shielding traces.

FIGS. 10A and 10B provide an alternate exemplary transformer 1000 that shields the secondary coil vertically. This approach may provide some benefit because the secondary coil is relatively insensitive to parasitics to ground. The transformer 1000 includes a first coil 1002. The transformer 1000 also includes a second coil 1004. The first coil 1002 and the second coil 1004 are symmetrical across an axis of symmetry 1006. The first coil 1002 includes a first input 1008 and a second input 1010. Vout from the lattice filter may be applied across the inputs 1008, 1010. The second coil 1004 includes a first output 1012 and a second output 1014. The second output 1014 may be coupled to ground 1016. A first shielding trace 1018 (e.g., a third coil) is positioned above the second coil 1004 and a second shielding trace 1020 (e.g., a fourth trace) below the second coil 1004 (better seen in FIG. 10B). Laminate or substrate layers 1022 may be positioned between the shielding traces 1018, 1020 and the second coil 1004.

Again, the coils 1002, 1004 may be formed from flat conductive metal traces positioned in a plane and having a physical gap 1024 therebetween. The shielding traces 1018, 1020 may be flat conductive metal or conductive traces that form respective coils that are positioned parallel to, but in different planes from the second coil 1004. The shielding traces 1018, 1020 are coupled to ground 1016. Further, the shielding traces 1018, 1020 have cuts 1026 at any point within the coil of the shielding traces 1018, 1020.

Figure 11A:
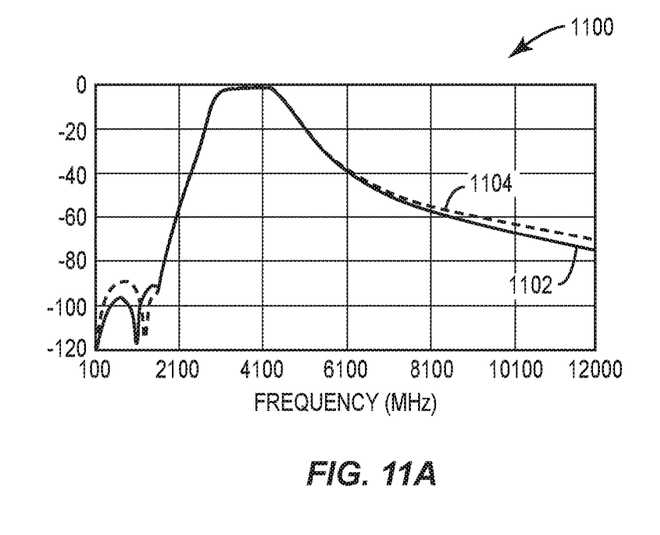
FIGS. 11A and 11B compare the performance of the transformer structures of FIGS. 8 and 10A in the wideband and passband, respectively.
Figure 11B:
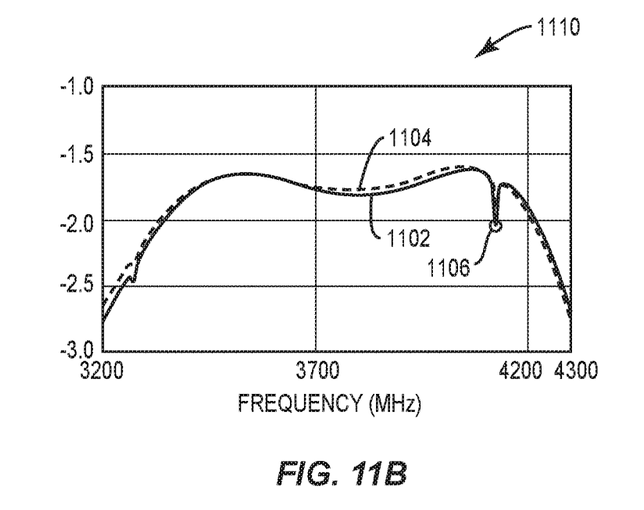

FIGS. 11A and 11B illustrate graphs 1100 and 1110 that compare the performance of the lattice filter system using the transformer 800 of FIG. 8A (line 1102) and the lattice filter system using the transformer 1000 of FIG. 10A (line 1104) in the wideband and passband, respectively. As can be seen, performance is similar although the line 1104 shows better performance in the passband and a smaller notch 1106. As illustrated, the notch 1106 is about 0.1 dB less using the transformer 1000.

If the notch 1106 is intolerable, and use of any of the above-identified techniques do not sufficiently suppress the notch 1106, the notch 1106 may be suppressed by increasing separation of the coils 1002, 1004, albeit at the expense of decreased mutual coupling.

It should be appreciated that there are other ways to increase the mutual coupling. One such way is through the use of an additional resonant inductor as better seen in the transformer 1200 of FIG. 12. The method is applicable to general coupled inductor systems and not necessarily restricted to balun structures. The transformer 1200 includes a first coil 1202 and a second coil 1204. The first coil 1202 includes a first input 1206 and a second input 1208. The second coil 1204 includes a first output 1210 and a second output 1212. A first capacitor 1214 may be coupled across the inputs 1206, 1208. A second capacitor 1216 may be coupled across the outputs 1210, 1212. The second output 1212 may be coupled to a ground 1218. A third coil 1220 is provided adjacent to the second coil 1204. The third coil 1220 is coupled to a third capacitor 1222 to form a resonant circuit 1224. There are now three coupling coefficients K12, K23, and K13. The value of the third capacitor 1222 may be varied to set the center frequency for the resonant circuit 1224.

Figure 12:
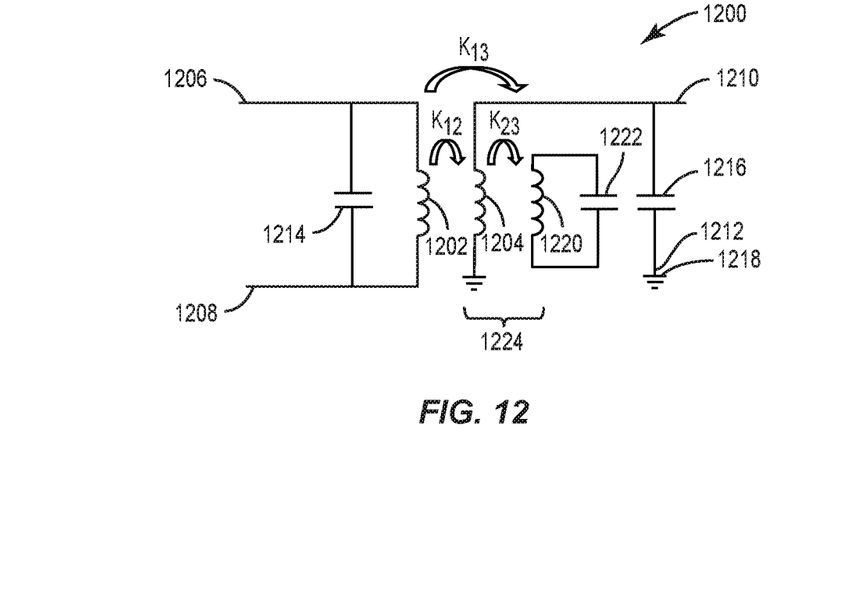
FIG. 12 illustrates a circuit diagram of an exemplary transformer structure having a third coil to enhance mutual coupling between a first and second coil.
Figure 13A:
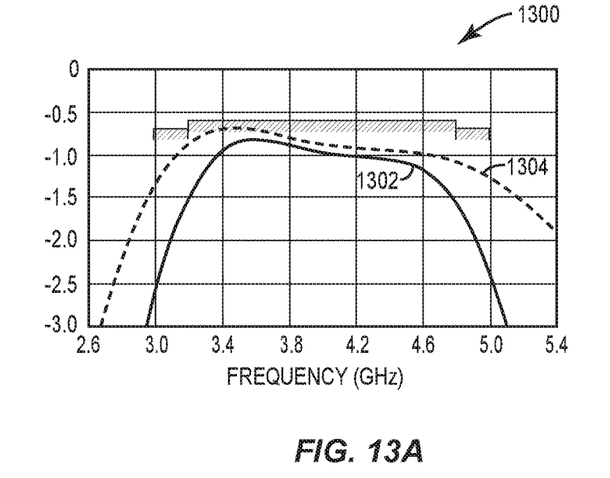
FIGS. 13A and 13B compare the performance of the transformer of FIG. 12 with a conventional transformer in the passband and wideband, respectively.
Figure 13B:
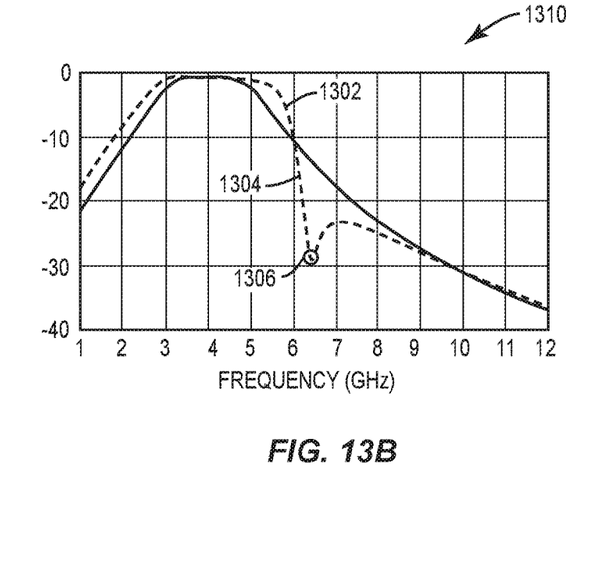

FIGS. 13A and 13B show graphs 1300, 1310 which compare the performance of a conventional transformer (line 1302) to the performance of the transformer 1200 of FIG. 12 (line 1304) in the passband and wideband, respectively. As can be seen by line 1302, the performance in the passband attenuates the frequencies of interest less than the conventional transformer. Likewise, the rejection for the transformer 1200 is steeper at higher frequencies with a strong rejection at notch 1306.

Figure 14A:
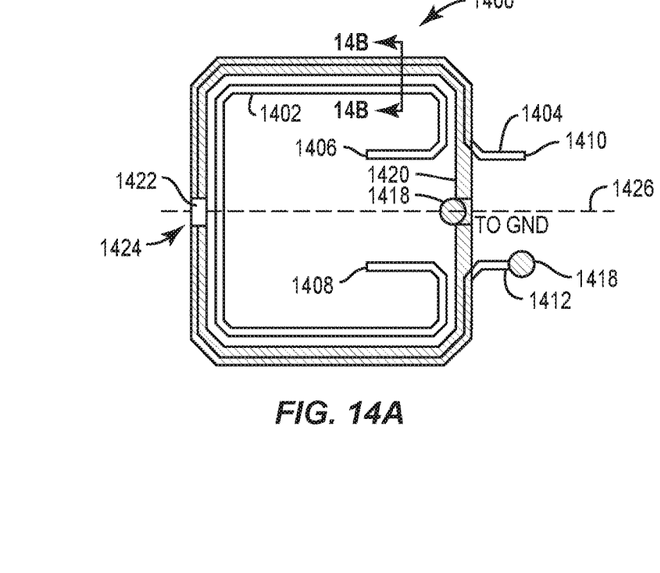
FIG. 14A illustrates a top plan view of an exemplary transformer corresponding to the circuit of FIG. 12.

The method described above may be utilized to enhance mutual coupling of transformer baluns in lattice filter systems. FIG. 14A illustrates a transformer 1400 with a third coil and shielding. Specifically, the transformer 1400 includes a first coil 1402 and a second coil 1404. The first coil 1402 includes a first input 1406 and a second input 1408. The second coil 1404 includes a first output 1410 and a second output 1412. The second output 1412 may be coupled to a ground 1418. A third coil or conductor 1420 is provided vertically on top of the second coil 1404. The third coil or conductor 1420 is coupled to a capacitor 1422 to form a resonant circuit 1424. The third coil 1420 is coupled to the ground 1418 to serve as both a resonant circuit which enhances mutual coupling and a shield. The transformer 1400 may be symmetrical across an axis of symmetry 1426.

Figure 14B:
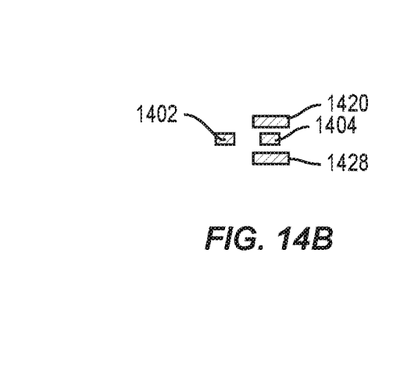
FIG. 14B illustrates a cross-sectional view of the transformer of FIG. 14A along lines 14B-14B.

As illustrated in FIG. 14B, the different planes of the coils 1402, 1404 relative to the third coil or conductor 1420 is highlighted. Also, it should be appreciated that a fourth coil or conductor 1428 may be provided to provide additional shielding. While not illustrated, the fourth coil or conductor 1428 may also include a capacitor like the capacitor 1422 to form a resonant circuit. Likewise, the fourth coil or conductor 1428 is coupled to ground.

While not shown, it is also possible to put the first coil 1402 and the second coil 1404 in different planes as shown in FIGS. 8C and 8D. Likewise, it is possible to put the resonant circuit 1424 of the third coil or conductor 1420 in the same plane with the first coil 1402 and the second coil 1404.

Figure 15A:
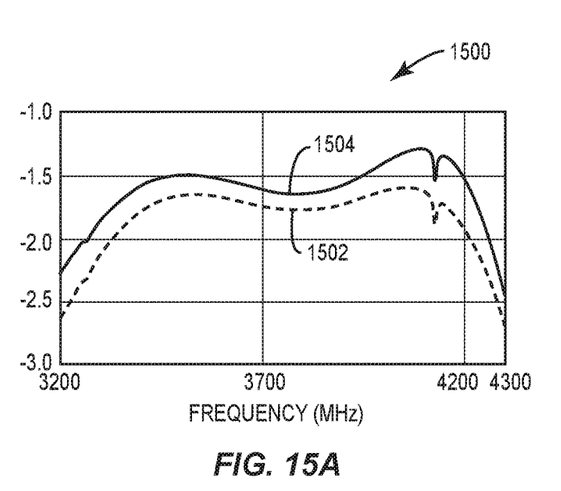
FIGS. 15A and 15B compare the performance of the transformer of FIG. 14 to the transformer structure of FIG. 10A in the passband and wideband, respectively.
Figure 15B:
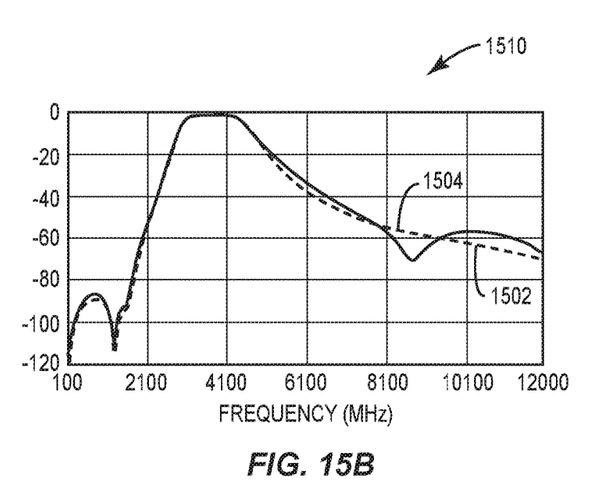

FIGS. 15A and 15B show graphs 1500 and 1510 that compare performance of a lattice filter system using the transformer 1000 of FIG. 10A (line 1502) to a lattice filter system using the transformer 1400 of FIG. 14 (line 1504) over the passband and wideband, respectively.

Figure 16A:
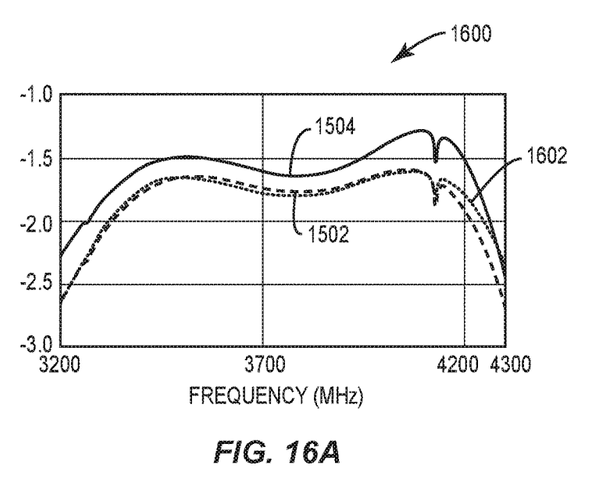
FIGS. 16A and 16B compare the performance of the transformer of FIG. 14 to the transformer structure of FIG. 10A and a transformer similar to that of FIG. 14, but with increased trace separation in the passband and wideband, respectively.
Figure 16B:
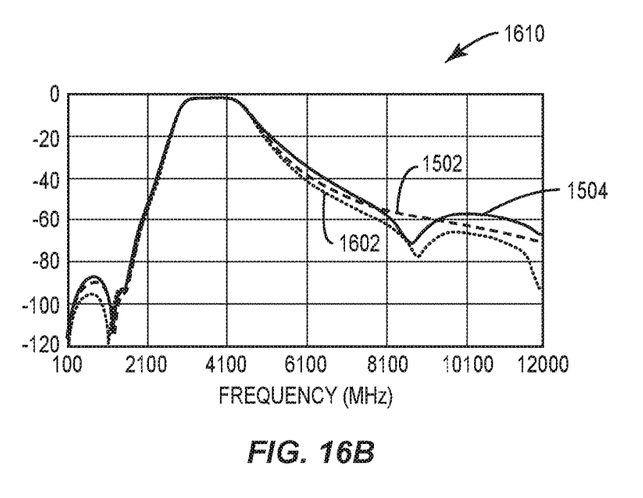

With the improved coupling, it may be feasible to separate the coils 1402, 1404 to reduce the capacitance to ground 1418 of the first coil 1402. Such separation may reduce the notch in the passband. Accordingly, FIGS. 16A and 16B show graphs 1600 and 1610, substantially similar to graphs 1500, 1510 but with line 1602 that has increased trace separation.

Those skilled in the art will recognize improvements and modifications to the preferred embodiments of the present disclosure. All such improvements and modifications are considered within the scope of the concepts disclosed herein and the claims that follow.

What is claimed is:

1. A transformer comprising:
a first coil comprising an input;
a second coil inductively coupled to the first coil, the second coil comprising an output; and
a resonant circuit comprising a third coil and a third capacitor, the third coil inductively coupled to the first coil and the second coil but electrically isolated from the first coil.

2. The transformer of claim 1, wherein the resonant circuit is coupled to ground.

3. The transformer of claim 1, wherein the second coil is coupled to ground.

4. The transformer of claim 3, wherein the resonant circuit is coupled to ground.

5. The transformer of claim 1, wherein the first coil is symmetrical across an axis of symmetry.

6. The transformer of claim 1, wherein the second coil is symmetrical across an axis of symmetry.

7. The transformer of claim 1, further comprising a second capacitor, the second capacitor directly serially coupled to the second coil, wherein the second capacitor is coupled to ground.

8. The transformer of claim 1, wherein the first coil and the second coil are co-planar in a first plane.

9. The transformer of claim 8, wherein the resonant circuit is positioned in a second plane parallel to but different than the first plane.

10. The transformer of claim 8, wherein the resonant circuit is positioned in the first plane.

11. The transformer of claim 1, wherein the first coil is in a first plane and the second coil is in a second plane different from the first plane.

12. A filter system comprising:
a lattice filter comprising a lattice output; and
a transformer comprising:
a first coil comprising an input coupled to the lattice output;
a second coil inductively coupled to the first coil, the second coil comprising an output; and
a resonant circuit comprising a third coil and a third capacitor, the third coil inductively coupled to the first coil and the second coil but electrically isolated from the first coil.

13. The filter system of claim 12, wherein the resonant circuit is coupled to ground.

14. A filter system comprising:
a lattice filter comprising a filter output; and
a transformer comprising:
a first coil comprising an input coupled to the filter output, the first coil having an axis of symmetry and being symmetrical across the axis of symmetry;
a second coil inductively coupled to the first coil, the second coil comprising an output, the second coil having a second axis of symmetry and being symmetrical across the second axis of symmetry; and
a shielding trace proximate the first coil and the second coil, the shielding trace configured to reduce cross-capacitance between the first coil and the second coil, wherein the shielding trace is coupled to ground.

15. The filter system of claim 14, wherein:
the first coil and the second coil are co-planar in a first plane; and
the shielding trace comprises a third conductor positioned between the first coil and the second coil in the first plane.

16. The filter system of claim 14, wherein:
the first coil and the second coil are co-planar in a first plane; and
the shielding trace comprises a third conductor positioned in a second plane parallel to but different than the first plane.

17. The filter system of claim 16, wherein the shielding trace further comprises a fourth conductor positioned in a third plane parallel to but different than the first and second planes.

18. The filter system of claim 14, wherein the output comprises a first output and a second output and the second output is coupled to ground.

19. The filter system of claim 14, wherein the shielding trace comprises a third conductor and the third conductor defines a cut therein.

20. The filter system of claim 14, wherein the first coil is positioned in a first plane and the second coil is positioned in a second plane different than the first plane.

* * * * *